United States Patent
Yadav et al.

(10) Patent No.: US 10,348,414 B2
(45) Date of Patent: Jul. 9, 2019

(54) CLOCK-AND-DATA RECOVERY (CDR) CIRCUITRY FOR PERFORMING AUTOMATIC RATE NEGOTIATION

(71) Applicant: Avago Technologies International Sales Pte. Limited, Singapore (SG)

(72) Inventors: Ajay Yadav, Santa Clara, CA (US); Samir Aboulhouda, Cupterino, CA (US); Faouzi Chaahoub, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 107 days.

(21) Appl. No.: 15/199,721

(22) Filed: Jun. 30, 2016

(65) Prior Publication Data

US 2018/0006799 A1 Jan. 4, 2018

(51) Int. Cl.
| | |
|---|---|
| H04B 10/06 | (2006.01) |
| H04B 10/61 | (2013.01) |
| H04L 7/033 | (2006.01) |
| H03L 7/08 | (2006.01) |
| H04B 10/69 | (2013.01) |
| H04L 7/00 | (2006.01) |

(52) U.S. Cl.
CPC ......... *H04B 10/616* (2013.01); *H03L 7/0807* (2013.01); *H04B 10/69* (2013.01); *H04L 7/033* (2013.01); *H04L 7/0004* (2013.01)

(58) Field of Classification Search
CPC ..... H04L 7/0331; H04L 7/033; H04L 7/0004; H04J 3/0638; H04B 10/616; H03L 7/087; H03L 7/095; H03L 7/00

USPC ............... 398/155, 154, 187, 188, 202, 208
See application file for complete search history.

(56) References Cited

U.S. PATENT DOCUMENTS

| | | | | |
|---|---|---|---|---|
| 7,016,613 | B2 * | 3/2006 | Savoj | H03D 13/004 |
| | | | | 327/157 |
| 7,315,596 | B2 * | 1/2008 | Payne | H03L 7/0814 |
| | | | | 375/355 |
| 7,366,268 | B2 * | 4/2008 | Mo | H04B 1/71632 |
| | | | | 375/354 |
| 7,437,079 | B1 * | 10/2008 | Hofmeister | H04B 10/40 |
| | | | | 375/219 |
| 7,486,894 | B2 * | 2/2009 | Aronson | H04B 10/40 |
| | | | | 398/128 |
| 7,580,497 | B2 * | 8/2009 | Wang | H03K 3/354 |
| | | | | 375/326 |
| 7,664,401 | B2 * | 2/2010 | Nelson | H04B 10/40 |
| | | | | 398/135 |
| 7,835,648 | B2 * | 11/2010 | Hofmeister | H04B 10/40 |
| | | | | 38/137 |
| 8,285,154 | B2 * | 10/2012 | Reyna | H04B 10/695 |
| | | | | 398/202 |

(Continued)

*Primary Examiner* — Hibret A Woldekidan
(74) *Attorney, Agent, or Firm* — Sheridan Ross P.C.

(57) ABSTRACT

A CDR circuit for use in an optical receiver is provided that performs automatic rate negotiation. The CDR circuit is configured to determine whether the incoming data signal has a first, second or third data rate. If the CDR circuit determines that the incoming data signal has the first data rate, the CDR circuit places itself in a bypass mode of operations so that CDR is not performed. If the CDR circuit determines that the incoming data signal has the second or third data rates, the CDR circuit places itself in a CDR mode of operations and performs CDR on the incoming data signal.

20 Claims, 3 Drawing Sheets

(56) References Cited

U.S. PATENT DOCUMENTS

| | | | | |
|---|---|---|---|---|
| 8,300,753 | B2* | 10/2012 | Nedovic | H03L 7/0891 |
| | | | | 375/354 |
| 8,971,718 | B2* | 3/2015 | Chow | H04L 7/0337 |
| | | | | 398/155 |
| 9,413,517 | B2* | 8/2016 | Takanashi | H03L 7/07 |
| 9,882,539 | B1* | 1/2018 | Shringarpure | H03G 3/3084 |
| 2004/0052528 | A1* | 3/2004 | Halgren | H04J 14/02 |
| | | | | 398/75 |
| 2005/0057290 | A1* | 3/2005 | Dalton | H03D 13/003 |
| | | | | 327/156 |
| 2009/0148155 | A1* | 6/2009 | Latchman | H04B 10/58 |
| | | | | 398/2 |
| 2011/0293285 | A1* | 12/2011 | Aronson | H04B 10/40 |
| | | | | 398/135 |
| 2012/0223750 | A1* | 9/2012 | Zhao | H03L 7/07 |
| | | | | 327/148 |
| 2014/0037033 | A1* | 2/2014 | Hoang | H03L 7/087 |
| | | | | 375/355 |

* cited by examiner

CLOCK-AND-DATA RECOVERY (CDR) CIRCUITRY FOR PERFORMING AUTOMATIC RATE NEGOTIATION

TECHNICAL FIELD OF THE INVENTION

The invention relates to optical receivers, and, more particularly, to clock-and-data recovery (CDR) circuitry of an optical receiver that performs automatic data rate negotiation.

BACKGROUND OF THE INVENTION

A typical optical receiver includes at least one photodiode that detects an optical data signal and converts it into an electrical current signal, at least one transimpedance amplifier (TIA) that converts the electrical current signal into an electrical voltage signal and CDR circuitry that processes the electrical voltage signal to recover the clock and then uses the recovered clock to sample the data in order to recover the data. Typical CDR circuitry includes a phase-locked loop that phase-aligns a local reference clock with transitions in the incoming data signal and then uses the phase-aligned reference clock to sample the incoming data signal.

In the optical communications industry, efforts are continuously being made to increase data rates. As data rates are increased, standards committees in the optical communications industry set standards that govern the mechanical and electrical designs on optical communications modules. In addition to formal standards, multi-source agreements (MSAs) are entered into among multiple manufacturers for providing de facto standards for making products that are compatible across vendors. One such committee is the Small Form Factor (SFF) Committee.

Small form factor pluggable (SFP) optical transceiver modules have a form factor and electrical interface that are specified by an MSA under the auspices of the SFF Committee. An MSA known as SFF 8419 is a 32 Gigahertz (GHz) standard that requires that newly manufactured SFP optical transceiver modules be backwards compatible with modules that operate at 16 GHz and 8 GHz data rates. Because of the backwards compatibility requirement, the newer modules are required by the MSA to meet the same form factor and electrical interface standards specified for the earlier modules. The specified electrical interface provides a single rate select bit communicated over a single input/output (I/O) pin to indicate whether the incoming data signal is a 32 GHz signal or is other than a 32 GHz signal. If the rate select bit is high, this indicates that the incoming data signal is a 32 GHz signal. If the rate select bit is low, this indicates that the incoming data signal is other than a 32 GHz signal. Thus, when the rate select bit is low, it is left up to the module to determine whether the incoming data signal is an 8 GHz signal or a 16 GHz signal and to frequency and phase lock onto the incoming data signal within a specified time frame. The process of determining the data rate of the incoming data signal and of frequency and phase locking onto the incoming data signal within a specified time frame is referred to hereinafter as automatic rate negotiation. A need exists for a CDR that is capable of performing automatic rate negotiation.

DETAILED DESCRIPTION

Figure 1:
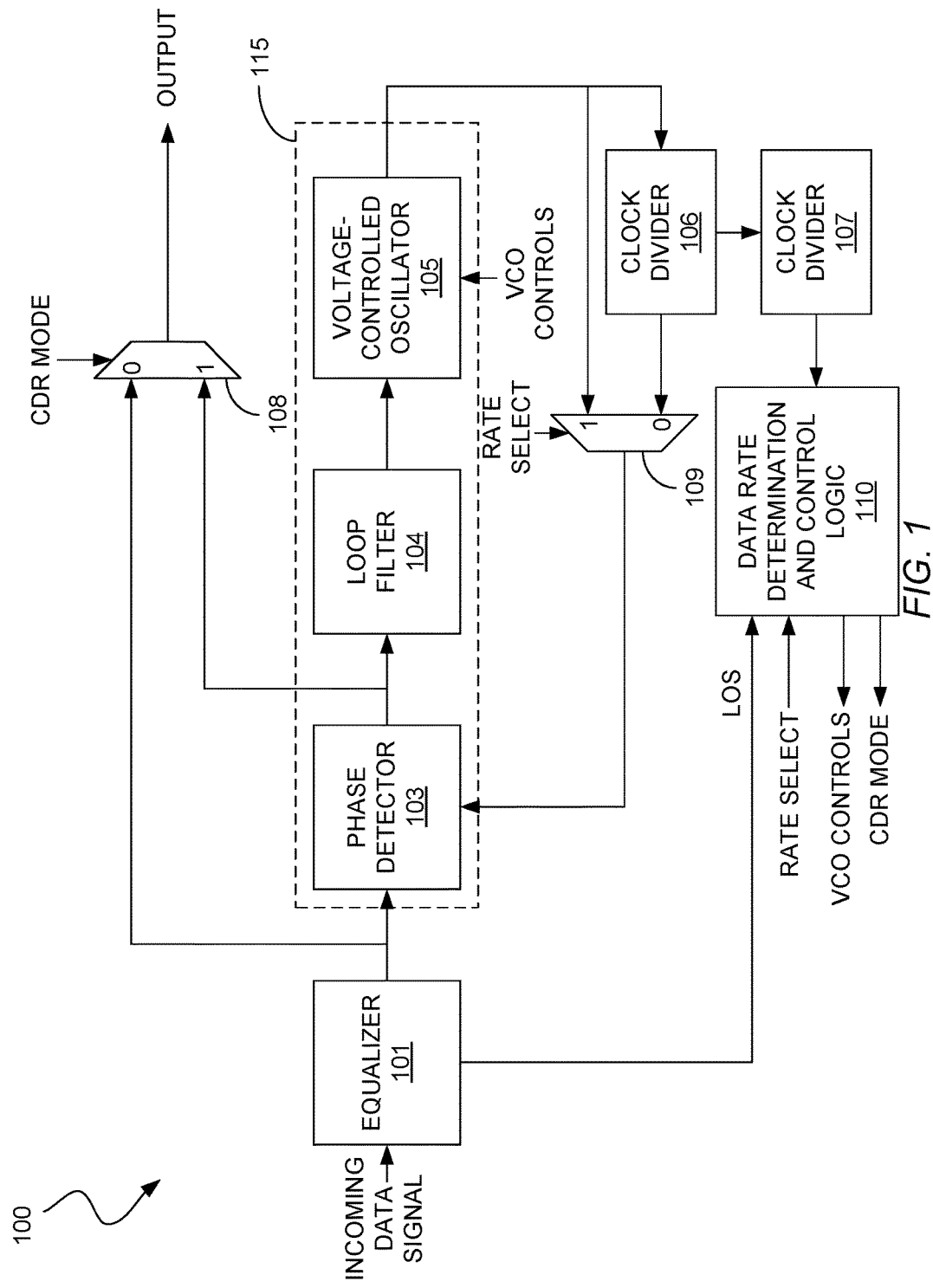
FIG. 1 illustrates a block diagram of CDR circuitry in accordance with an illustrative embodiment for performing automatic rate negotiation.

In accordance with illustrative embodiments, CDR circuitry is provided that performs automatic rate negotiation. An illustrative embodiment of a CDR that performs automatic rate negotiation to meet the requirements of MSA SFF 8419 is provided herein. It will be understood by those skilled in the art, however, that the invention is not limited to performing automatic rate negotiation in accordance with this MSA for the particular data rates referred to therein and that the principles and concepts described herein are applicable to performing automatic rate negotiation for any data rates. A few illustrative embodiments of the offset measurement and cancellation circuitry and method will now be described with reference to the FIGS. 1-3, in which like reference numerals represent like elements, features or components.

FIG. 1 illustrates a block diagram of CDR circuitry 100 in accordance with an illustrative embodiment for performing automatic rate negotiation. In accordance with this embodiment, CDR is only performed if the incoming data signal is either a 16 GHz signal or a 32 GHz signal. If the incoming data signal is an 8 GHz signal, CDR is bypassed because it is not necessary to perform CDR for an 8 GHz signal. It should be noted that although the SFF 8419 MSA refers to 32 GHz, 16 GHz and 8 GHz rates, the actual rates are 28 GHz, 14 GHz and 8 or 8.5 GHz. For purposes of discussion, it will be assumed that the rates are 32 GHz, 16 GHz and 8 GHz because the principles and concepts described herein apply regardless of the actual rates.

The CDR circuitry 100 comprises an equalizer 101, a phase detector 103, a loop filter 104, a voltage controlled oscillator (VCO) 105, a first clock divider 106, a second clock divider 107, a first 2-to-1 multiplexer (MUX) 108, a second 2-to-1 MUX 109, and data rate determination and control logic 110. The phase detector 103, the loop filter 104 and the VCO 105 together comprise a phase-locked loop (PLL) 115 of the CDR circuitry 100. In accordance with an embodiment, the data rate determination and control logic 110 is a state machine that receives as input the aforementioned rate select signal and a loss of signal (LOS) indicator. The LOS indicator is output from the equalizer 101. When the equalizer 101 detects that there is no incoming data signal, it asserts the LOS indicator to inform the data rate determination and control logic 110 that there is no incoming data.

The rate select signal is typically provided by the host (not shown) and controlled by the user. When the rate select signal is asserted, the data rate determination and control logic 110 determines that the incoming data signal is a 32 GHz signal. The logic 1 input of the MUX 108 receives a 32 GHz clock signal from the VCO 105 and outputs that signal to the phase detector 103 when the rate select signal is a logic 1. The clock divider 106 also receives the 32 GHz clock signal from the VCO 105 and divides it in half to achieve a 16 GHz clock signal, which is applied to the logic 0 input of the MUX 109. When the rate select signal is a logic 0, the MUX 109 outputs the 16 GHz clock signal to the phase detector 103.

When the incoming data signal is either a 16 GHz signal or a 32 GHz signal, the CDR circuitry 100 performs CDR in the manner in which CDR is typically performed to recover the clock and the data. The MUX 108 acts as an output of the CDR circuitry 100 whereas the equalizer 101 acts as an input of the CDR circuitry 100. When the incoming data signal is an 8 GHz signal, the PLL 115 of the CDR circuitry 100 is bypassed such that CDR is not performed. In the latter case, the CDR mode signal is low and the output of the equalizer 101 becomes the output of the CDR circuitry 100. When the incoming data signal is either a 16 GHz or 32 GHz signal, the CDR mode signal is high, causing the output of the phase detector 103 to become the output of the MUX 108. When the rate select signal is low, the data rate determination and control logic 110 determines whether the incoming data signal is an 8 GHz signal or a 16 GHz signal and deasserts or asserts the CDR mode signal, respectively. The manner in which the data rate determination and control logic 110 makes these determinations is described below with reference to FIGS. 2 and 3.

In cases where the rate select signal is low, in order for the data rate determination and control logic 110 to make the determination as to whether the incoming data signal is an 8 GHz signal or a 16 GHz signal, it receives frequency lock information from the VCO 105 and phase lock information from the phase detector 103 via VCO 105. Based on the received frequency lock and phase lock information, the data rate determination and control logic 110 determines whether the PLL 115 is frequency and phase locked onto a 16 GHz incoming data signal. If it is not, then the data rate determination and control logic 110 determines that the incoming data signal is an 8 GHZ signal and causes the CDR mode signal to be deasserted so that the PLL 115 is bypassed.

Figure 2:
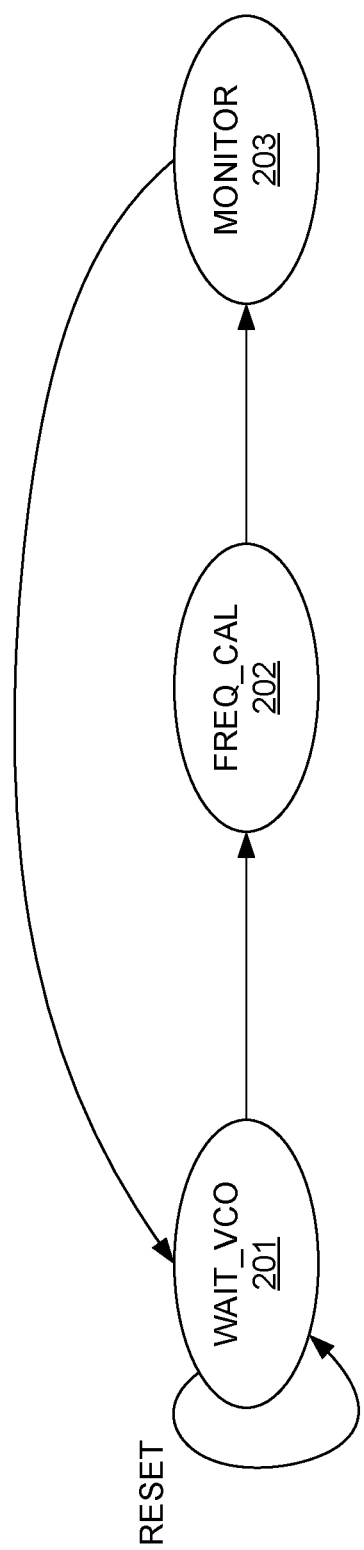
FIG. 2 is a state diagram that represents the algorithm performed by the state machine shown in FIG. 1 in accordance with an embodiment.

FIG. 2 is a state diagram that represents the algorithm performed by the data rate determination and control logic 110 shown in FIG. 1. When the algorithm starts up, the data rate determination and control logic 110 enters a wait_VCO state 201. In this state, registers (not shown) of the VCO 105 are initialized via the VCO control signals that are sent by the data rate determination and control logic 110 to the VCO 105, as shown in FIG. 1. After the VCO 105 has been initialized, the data rate determination and control logic 110 exits the wait_VCO state 201 and enters a frequency_calibration state 202. In the frequency_calibration state 202, the VCO calibrates itself to generate the 32 GHz clock. Once the VCO 105 has been calibrated, the data rate determination and control logic 110 exits the frequency_calibration state 202 and enters a monitor state 203. In the monitor state 203, the data rate determination and control logic 110 monitors the VCO 105 and controls the CDR circuitry 100 to cause various tasks to be performed, as will now be described with reference to FIG. 3.

Figure 3:
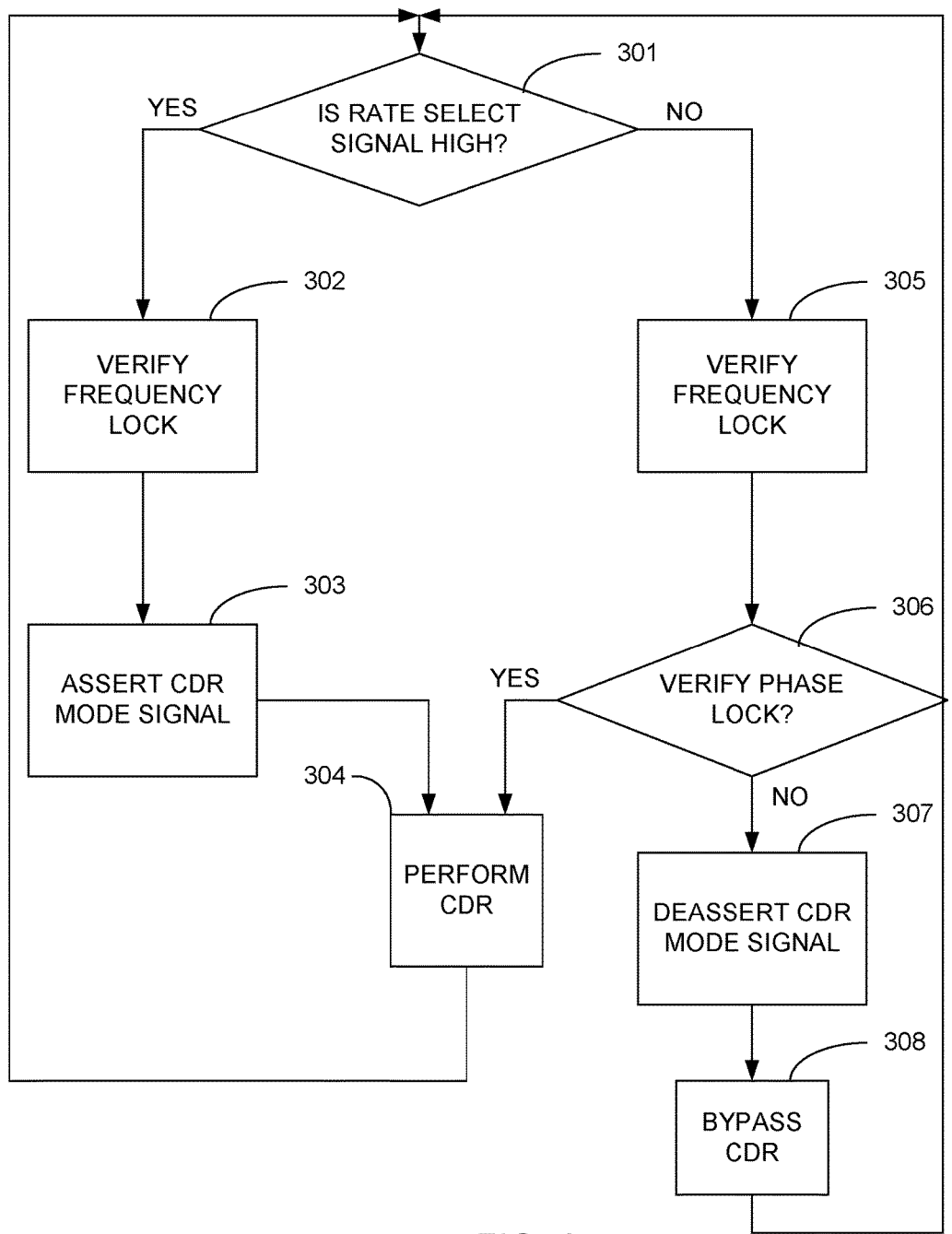
FIG. 3 is a flow diagram representing processes performed by the state machine shown in FIG. 1 when the state machine is in the monitor state shown in FIG. 2.

FIG. 3 is a flow diagram representing processes performed by the data rate determination and control logic 110 when it is in the monitor state 203 shown in FIG. 2. In the monitor state 203, a determination is made as to whether the rate select signal is high or low. If the rate select signal is high, the process proceeds to block 302 where the data rate determination and control logic 110 verifies that the VCO 105 remains frequency locked to the incoming data signal. The process then proceeds to block 303 where the data rate determination and control logic 110 asserts the CDR mode signal being provided to the MUX 108. The process then proceeds to block 304 and CDR is performed on the incoming data signal such that the output of the CDR circuit 100 output from the MUX 108 is the output of the phase detector 103.

If at block 301, the data rate determination and control logic 110 determines that the rate select signal is low, the process proceeds to block 305 and the VCO 105 frequency locks to the incoming data signal. It should be noted that the even though the VCO 105 generates a 32 GHz clock signal, it is capable of frequency locking to an 8 or 16 GHz incoming data signal, but is only capable of phase locking to either a 16 GHz or 32 GHz incoming data signal. When the rate select signal is low, the 16 GHz clock signal output from the clock divider 106 is being provided by the MUX 109 to the phase detector 103. Thus, the phase detector 103 will be comparing the phase of the incoming data signal with a 16 GHz clock signal when the rate select signal is low.

Once frequency lock has been verified at block 305, the process proceeds to block 306 where the data rate determination and control logic 110 determines whether the VCO 105 is phase locked to the incoming data signal. If not, this means that the incoming data signal is an 8 GHz signal rather than a 16 GHz signal, and therefore the process proceeds to block 307 where the data rate determination and control logic 110 deasserts the CDR mode signal provided to the MUX 108. The process then proceeds to block 308 where CDR mode is bypassed such that the output of the equalizer 101 is output from the MUX 108 as the output of the CDR circuitry 100.

If the data rate determination and control logic 110 verifies at block 306 that the VCO 105 was able to phase lock onto the incoming data signal, this means that the incoming data signal is a 16 GHz signal, and therefore CDR needs to be performed. Therefore, the process proceeds to block 304 where CDR is performed such that the output of the phase detector 103 is output from the MUX 108 as the output of the CDR circuitry 100. The phase detector 103 samples and retimes the incoming data signal to perform CDR such that the output of the MUX 108 is the retimed data signal.

With reference again to FIG. 2, if the data rate determination and control logic 110 is not able to verify the frequency lock at blocks 302 or 305, the data rate determination and control logic 110 exits the monitor state 203 and re-enters the wait_VCO state 201. When the data rate determination and control logic 110 re-enters the wait_VCO state 201, the data rate determination and control logic 110 delivers the VCO control signals to the VCO 105 to cause it to reinitialize itself. The data rate determination and control logic 110 then exits the wait_VCO state 201 and re-enters the frequency_calibration state 202, where the VCO 105 is recalibrated. The data rate determination and control logic 110 then exits the frequency_calibration state 202 and re-enters the monitor state 203 where it resumes performing the algorithm represented by the flow diagram shown in FIG. 3.

With reference again to FIG. 1, when the rate select signal is low, the 32 GHz clock signal generated by the VCO 105 is divided in half by the clock divider 106 to obtain a 16 GHz clock signal. The 16 GHz clock signal is provided to the phase detector 103. The phase detector 103 generates pulses indicative of the phase differences between the incoming data signal and the 16 GHz clock output from MUX 109. The loop filter 104 integrates these pulses and the VCO 105 receives the integration result and uses it to adjust the VCO clock in an attempt to phase lock the VCO 105 onto the incoming data signal (block 306 in FIG. 3). If the VCO 105 is unable to phase lock onto the incoming data signal within a predetermined threshold time period, then the data rate determination and control logic 110 determines that the incoming data signal is an 8 GHz signal and deasserts the CDR mode signal so that the output of the equalizer 101 is output from the MUX 108. In this way, the data rate determination and control logic 110 causes the CDR process to be bypassed when the incoming data signal is an 8 GHz signal. The 16 GHz clock signal generated by the clock divider 106 is further subdivided by clock divider 107 into a lower frequency (e.g., 200 to 400 Megahertz (MHz)) signal for processing by the data rate determination and control logic 110. Processing a lower frequency signal in the data rate determination and control logic 110 allows less expensive and less complex logic to be used in the data rate determination and control logic 110.

It should be noted that in accordance with the illustrative embodiment of the CDR circuitry 100 shown in FIG. 1, the CDR circuitry 100 is full-rate CDR circuitry, i.e., the reference clock generated by the VCO 105 is the same as the incoming data signal having the 32 GHz data rate onto which the PLL 115 is intended to frequency and phase lock. Alternatively, the CDR circuitry could employ, for example, a half-rate design, in which case the reference clock of the VCO 105 would be one-half the data rate of the incoming data signal, or 16 GHz. In the latter case, the phase detector would be a half-rate phase detector with a serializer, driven by the VCO reference clock, at the output of the phase detector. Because the manner in which a full-rate or half-rate CDR circuit may be designed is well known to those skilled in the art, only the full-rate CDR implementation is described herein in the interest of brevity. Persons of skill in the art will understand, in view of the description provided herein, the manner in which half-rate CDR circuitry may be designed to perform automatic rate negotiation consistent with the principles and concepts described herein.

The data rate determination and control logic 110 may be may type of processor capable of being programmed or configured to perform the tasks described above with reference to FIGS. 1-3. Suitable processors for this purpose include, for example, an application specific integrated circuit (ASIC), a digital signal processor (DSP), a microprocessor, a microcontroller, a programmable logic controller (PLC), and a block of combinational logic. The functions of the data rate determination and control logic 110 may be performed in software or a combination of hardware and software and/or firmware. To the extent that any of those functions are performed in software and/or firmware, the software and/or firmware is stored in a non-transitory computer-readable memory device, such as a solid state memory device, for example.

It should be noted that although the illustrative embodiments have been described with reference to a few illustrative embodiments for the purpose of demonstrating the principles and concepts of the invention. Persons of skill in the art will understand how the principles and concepts of the invention can be applied to other embodiments not explicitly described herein. It should also be noted that the circuits and method described above with reference to FIGS. 1-3 are merely examples of suitable circuit configurations and methods that demonstrate the principles and concepts of the invention. As will be understood by those skilled in the art in view of the description being provided herein, many modifications may be made to the embodiments described herein while still achieving the goals of the invention, and all such modifications are within the scope of the invention.

What is claimed is:
1. Clock and data recovery (CDR) circuitry configured to determine whether an incoming data signal has one of at least three different data rates which include a first, second and third data rate and to perform CDR on the incoming data signal when the incoming data signal has one of the second and third data rates and to bypass performing CDR when the incoming data signal has the first data rate, the CDR circuitry comprising:
an input that receives the incoming data signal;
data rate determination and control logic configured to determine which of the first, second and third data rates the incoming data signal has, the data rate determination logic causing the CDR circuit to be placed in one of a CDR bypass mode of operations and a CDR mode of operations based on the determined data rate of the incoming data signal;
CDR bypass circuitry configured to cause the incoming data signal to be sent to an output of the CDR circuitry without performing CDR when the CDR circuit is in the bypass mode of operations; and
a phase-locked loop (PLL) configured to, depending upon a data rate of the incoming data signal, frequency and phase lock a frequency and phase of a reference clock to a frequency and phase of the incoming data signal, respectively, and to output a recovered, retimed data signal from the PLL.

2. The CDR circuitry of claim 1, wherein the PLL includes a voltage-controlled oscillator (VCO) that obtains frequency lock and phase lock information as the PLL frequency and phase locks the reference clock to the incoming data signal, and wherein the data rate determination and control logic uses the frequency lock and phase lock information along with a rate select signal to determine whether the incoming data signal has the first, second or third data rate.

3. The CDR circuitry of claim 2, wherein if the rate select signal is asserted, the data rate determination and control logic determines that the incoming data signal has the third data rate, and wherein if the rate select signal is deasserted, the data rate determination and control logic determines that the incoming data signal has one of the first and second data rates.

4. The CDR circuitry of claim 3, wherein if the data rate determination and control logic determines that the incoming data signal has one of the first data rate and the second data rate, the data rate determination and control logic determines whether the incoming data signal has the first data rate or the second data rate, wherein if the data rate determination and control logic determines that the incoming data signal has the first data rate, the data rate determination and control logic places the CDR circuitry in CDR bypass mode of operations, and wherein if the data rate determination and control logic determines that the incoming data signal has the second data rate, the data rate determination and control logic places the CDR circuitry in the CDR mode of operations.

5. Clock and data recovery (CDR) circuitry configured to determine whether an incoming data signal has one of at least three different data rates which include a first, second and third data rate and to perform CDR on the incoming data signal when the incoming data signal has one of the second and third data rates and to bypass performing CDR when the incoming data signal has the first data rate, wherein the CDR bypass circuitry includes a first switching circuit that is electrically coupled to the input and to the output, the CDR bypass circuitry receiving the incoming data signal from the input and receiving a recovered, retimed data signal from the PLL, the first switching circuit being controlled by the data rate determination and control logic such that when the CDR circuitry is in the CDR bypass mode, the data rate determination and control logic causes the first switching circuit to output the incoming data signal therefrom and such that when the CDR circuit is in the CDR mode, the data rate determination and control logic causes the first switching circuit to output the recovered, retimed data signal therefrom.

6. The CDR circuitry of claim 5, further comprising:
a first clock divider that divides the reference clock in half to generate a second clock signal; and
a second switching circuit having first and second inputs that receive the reference clock signal and the second clock signal, respectively, and an output electrically coupled to the PLL, and wherein the second switching circuit is controlled by the data rate determination and control logic such that when the rate select signal is asserted, the data rate determination and control logic causes the second switching circuit to output the reference clock to the PLL and such that when the rate select signal is deasserted, the data rate determination and control logic causes the second switching circuit to output the second clock signal to the PLL.

7. Clock and data recovery (CDR) circuitry comprising:
an equalizer having an input and an output, input receiving an incoming data signal having one of a first, second and third data rate, the equalizer outputting an equalized data signal from the output thereof;
a phase-locked loop (PLL) configured to, depending upon a data rate of the incoming data signal, frequency and phase lock a frequency and phase of a reference clock to a frequency and phase of the equalized data signal, respectively, and to output a recovered, retimed data signal from an output of a phase detector of the PLL, an input of the phase detector being electrically coupled to the output of the equalizer;
a first switching circuit having first and second inputs and an output, the first and second inputs of the first switching circuit being electrically coupled to the outputs of the equalizer and the phase detector, respectively; and
data rate determination and control logic configured to determine which of the first, second and third data rates the incoming electrical data signal has and to place the first switching circuit in one of a CDR bypass mode of operations and a CDR mode of operations based on the determined data rate of the incoming data signal, wherein in the CDR mode of operations, the recovered, retimed data signal is output from the first switching circuit, and wherein in the CDR bypass mode of operations, the equalized data signal is output from the first switching circuit.

8. The CDR circuitry of claim 7, further comprising:
a first clock divider having an input and an output, the input of the first clock divider being electrically coupled to a voltage-controlled oscillator (VCO) of the PLL that generates the reference clock signal, the first clock divider dividing the reference clock down to a second clock signal; and
a second switching circuit having first and second inputs and an output, the output of the second switching circuit being electrically coupled to the phase detector of the PLL, the first input of the second switching circuit being electrically coupled to the VCO for receiving the reference clock signal therefrom, the second input of the second switching circuit being electrically coupled to the first clock divider for receiving the second clock signal therefrom, wherein the data rate determination and control logic receives a rate select signal, wherein when the rate select signal is asserted, the second switching circuit outputs the reference clock signal to the phase detector, and wherein when the rate select signal is deasserted, the second switching circuit outputs the second clock signal to the phase detector.

9. The CDR circuitry of claim 8, wherein if the rate select signal is asserted, the data rate determination and control logic determines that the incoming data signal has the third data rate, and wherein if the rate select signal is deasserted, the data rate determination and control logic determines that the incoming data signal has one of the first and second data rates.

10. The CDR circuitry of claim 9, wherein if the data rate determination and control logic determines that the incoming data signal has one of the first data rate and the second data rate, the data rate determination and control logic determines whether the incoming data signal has the first data rate or the second data rate, wherein if the data rate determination and control logic determines that the incoming data signal has the first data rate, the data rate determination and control logic places the CDR circuitry in CDR bypass mode of operations, and wherein if the data rate determination and control logic determines that the incoming data signal has the second data rate, the data rate determination and control logic places the CDR circuitry in the CDR mode of operations.

11. The CDR circuitry of claim 8, further comprising:
a second clock divider having an input and an output, the input of the second clock divider being electrically coupled to the first clock divider for receiving the second clock signal and further subdivides the second clock signal to obtain a third clock signal, the output of the second clock divider being electrically coupled to the data rate determination and control logic for outputting the third clock signal to the data rate determination and control logic, the data rate determination and control logic processing the third clock signal to derive frequency lock information therefrom.

12. A method for performing data rate negotiation in clock and data recovery (CDR) circuitry, the method comprising:
receiving an incoming data signal possessing one of at least three data rates which include a first data rate, a second data rate, and a third data rate;
determining which of the first, second and third data rates the incoming data signal possesses;
placing the CDR circuitry in one of a CDR bypass mode of operations and a CDR mode of operations based on the determined data rate of the incoming data signal;
outputting the incoming data signal from an output of the CDR circuitry without performing CDR when the CDR circuit is in the bypass mode of operations;
performing CDR on the incoming data signal and outputting a recovered, retimed data signal from the output of the CDR circuitry when the CDR circuitry is in the CDR mode of operations;
determining that the incoming data signal possesses one of the first data rate and second data rate by using a using a phase-locked loop (PLL) of the CDR circuitry to, depending upon a data rate of the incoming data signal, frequency lock and phase lock a frequency and phase, respectively, of a clock signal to a frequency and phase, respectively, of the incoming data signal.

13. The method of claim 12, wherein the CDR circuitry is placed in the bypass mode if it is determined that the incoming data signal has the first data rate, and wherein the CDR circuitry is placed in the CDR mode if it is determined that the data rate of the incoming data signal is one of the second and third data rates.

14. The method of claim 13, wherein the step of determining the data rate includes processing a rate select signal in data rate determination and control logic of the CDR circuitry to determine whether to place the CDR circuitry in the bypass mode or CDR mode of operations.

15. The method of claim 14, wherein if the rate select signal is asserted, a determination is made that the incoming data signal has the third data rate, and wherein if the rate select signal is deasserted, a determination is made that the incoming data signal has one of the first data rate and the second data rate.

16. The method of claim 12, wherein if the PLL successfully frequency locks and phase locks the frequency and phase, respectively, of the clock signal to the frequency and phase, respectively, of the incoming data signal, a determination is made that the incoming data signal has the second data rate.

17. The method of claim 16, wherein the clock signal corresponds to a subdivided reference clock signal, and wherein the PLL uses the reference clock signal to frequency lock and phase lock the frequency and phase, respectively, of the incoming data signal to a frequency and phase, respectively, of the reference clock signal when the incoming data signal has the third data rate.

18. The method of claim 17, wherein the PLL includes a voltage-controlled oscillator (VCO) that obtains frequency lock and phase lock information as the PLL frequency and phase locks the reference clock signal to the incoming data signal.

19. The method of claim 18, further comprising:
using the frequency lock and phase lock information along with a rate select signal to determine whether the incoming data signal has the first, second or third data rate.

20. The method of claim 19, further comprising:
dividing the reference clock signal in half to generate a second clock signal; and
outputting the second clock signal to the PLL when a rate select signal provided to a switching circuit is deasserted.

* * * * *